US005164634A

United States Patent [19]

Convert et al.

[11] Patent Number: 5,164,634

[45] Date of Patent: Nov. 17, 1992

[54] ELECTRON BEAM DEVICE GENERATING MICROWAVE ENERGY VIA A MODULATED VIRTUAL CATHODE

[75] Inventors: Guy Convert, Vincennes; Jean-Pierre Brasile, Gif Sur Yvette, both of France

[73] Assignee: Thomson-CSF, Puteaux, France

[21] Appl. No.: 576,443

[22] PCT Filed: Jan. 26, 1990

[86] PCT. No.: PCT/FR90/00059

§ 371 Date: Sep. 13, 1990

§ 102(e) Date: Sep. 13, 1990

[87] PCT Pub. No. WO90/09029

PCT Pub. Date: Aug. 9, 1990

[30] Foreign Application Priority Data

Jan. 27, 1989 [FR] France ................................ 89 01007

[51] Int. Cl.[5] ............................ H01J 25/2; H03B 9/01

[52] U.S. Cl. ..................................... 315/5; 315/5.310; 331/79; 330/44

[58] Field of Search ...................... 315/4.5, 5.29, 5.31, 315/5.32, 5.33, 5.37; 331/79, 81; 330/44, 49; 332/165, 179

[56] References Cited

U.S. PATENT DOCUMENTS

| | | | |
|---|---|---|---|
| 2,252,565 | 8/1941 | Haeff | 331/81 X |
| 2,428,622 | 10/1947 | Gurewitsch | 315/39 |
| 4,345,220 | 8/1982 | Sullivan | 331/79 |
| 4,422,045 | 12/1983 | Barnett | 315/5 |
| 4,730,170 | 3/1988 | Kwan et al. | 331/79 |
| 4,745,336 | 5/1988 | Ohkawa | 315/5 X |
| 4,751,429 | 6/1988 | Minich | 315/5 |

FOREIGN PATENT DOCUMENTS

| | | |
|---|---|---|
| 975093 | 10/1961 | Fed. Rep. of Germany . |
| 2070322 | 9/1971 | France . |
| 852421 | 10/1960 | United Kingdom . |

OTHER PUBLICATIONS

1988 IEEE International Conference on Plasma Science, 6–8 Jun. 1988, Seattle, Washington, Conference Record—Abstracts, IEEE, (New York, U.S.).

D. Price, et al.: "Mode and Phase Locking of a cavity vircator by injected microwave power from a relativistic magnetron", voir p. 114.

SPIE vol. 873 Microwave and Particle Beam Sources and Propagation (1988), "Relativistic klystron amplifier", pp. 92–103, Friedman et al.

*Primary Examiner*—Eugene R. LaRoche
*Assistant Examiner*—Benny T. Lee
*Attorney, Agent, or Firm*—Oblon, Spivak, McClelland, Maier & Neustadt

[57] ABSTRACT

The invention relates to a device for producing microwave energy from an electron beam. The device includes:

an electron gun (1), allowing the production of an electron beam (8) in a so-called injection zone (3);

a microwave modulation circuit (7), allowing the superimposition of an alternating voltage at a given frequency on the voltage of the beam in the injection zone; the amplitude of this voltage is sufficient for ensuring, during one of its alternations, the transition between the passing state and the virtual cathode state, thus causing a modulation of the current carried by the electron beam;

an output microwave circuit (4) functioning at the frequency of the modulation signal and excited by the previous modulated current.

9 Claims, 2 Drawing Sheets

ELECTRON BEAM DEVICE GENERATING MICROWAVE ENERGY VIA A MODULATED VIRTUAL CATHODE

The present invention relates to an amplifier device for microwave frequencies and to an oscillator obtained from the amplifier device.

In order to generate and amplify microwaves, it is known to use in particular so-called velocity modulation electronic tubes. This type of tube comprises an electron gun, supplying an electron beam. The electrons of the beam undergo a periodic velocity modulation which causes their grouping into packets in certain zones of space. These packets then excite by impulse, according to their characteristic period, the oscillations of a microwave circuit (resonant cavity or line) by taking the energy necessary from their own kinetic energy.

In the electron beams of such tubes, the effects of the space charge are very large. In particular it is these which fix, for given voltages, a maximum value for the current which can be produced by the electron gun, or which can be carried in a given space, for an assembly of electrodes of given geometry. In the tubes of the type mentioned above, in order to obtain satisfactory results for gain, efficiency and signal quality, it is found necessary to limit the current carried by the electron beam to an intensity at least one order of magnitude less than the maximum intensity. Consequently, and considering the very principle of velocity modulation, these tubes must use long beams, usually requiring magnetic focussing; these generators are therefore heavy and bulky.

Devices are also known which are called vircators which, unlike the previous tubes, take advantage of the space charge effects. In a vircator there is injected, into a space, a current of electrons, usually equal to several times the maximum current which could actually pass through this space. There is therefore an accumulation of electrons which form a virtual cathode. This virtual cathode is unstable, i.e. it oscillates in space thus creating electromagnetic fields. With such a device, it is possible to obtain high microwave powers and to obtain this in a reduced volume. However, it is noted that the emitted signal is of mediocre quality, i.e. the power is emitted in numerous modes in a sequence of simultaneous or successive frequencies, and the applications of these types of signal are rather limited. Furthermore, the conversion efficiency is poor (in the order of 2 to 3% at best) with respect to the efficiency which can be obtained with velocity modulation tubes (often greater than 40%).

The subject of the present invention is a device intended to produce microwave energy from an electron beam, which overcomes the previous limitations, i.e. a conversion efficiency of the energy of the electron beam into microwave energy and a quality of the emitted signal comparable to those of velocity modulation tubes, having a weight and a volume comparable with those of vircators.

For this purpose, the device according to the invention comprises:

- an electron gun, capable of producing an electron beam such that the current which it carries is slightly less than the maximum current capable of being carried in the generator;
- a microwave circuit called a modulation circuit, allowing the application of an alternating voltage whose amplitude is sufficient for triggering, during one of its alternations, the formation of a virtual cathode no longer allowing the passage of electrons, the current transported by the beam thus being modulated at the so-called modulation frequency of the alternating voltage;
- an output microwave circuit intended to function substantially at the modulation frequency, or a multiple or sub-multiple of the latter, this output circuit being excited by the previous modulated current.

Other objects, features and results of the invention will emerge from the following description, given by way of non-limitative example and illustrated by the appended drawings in which.

In these various figures, the same references relate to the same elements.

Figure 1:
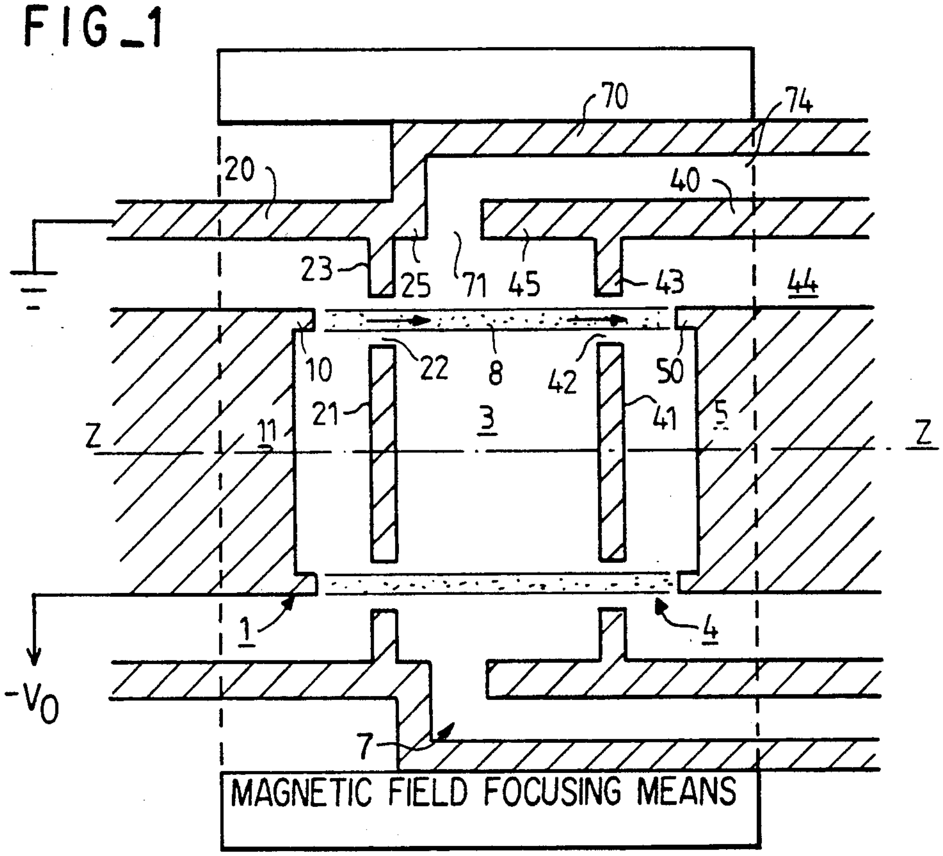
FIG. 1 shows a first embodiment of the device according to the invention.

FIG. 1 therefore shows a first embodiment of the device according to the invention seen in longitudinal diagrammatic cross-section.

The generator according to the invention is a structure of revolution about a longitudinal axis ZZ. It comprises an electron gun 1, formed from a cathode 11 and an anode formed from a frame 20 and a screen 21. The cathode 11 is in the form of a conducting cylinder of axis ZZ, whose circumference has a protrusion 10 such that the electrons emitted by this cathode form an annular beam, represented by a dotted zone 8 in the figure. The direction of propagation of the electrons of the beam 8 has been shown by arrows. The frame 20 of the anode is constituted by a hollow cylinder, having the same axis ZZ as the cathode. It is closed by an annular shoulder 23 and a screen 21 in the form of a disc, allowing an annular slit 22 to remain for the passage of the electron beam 8. The screen 21 is for example fixed by three lugs to the shoulder 23.

The generator according to the invention furthermore comprises a microwave output circuit 4 which is, in this embodiment, of coaxial type, formed by an inner conducting cylinder 5 and an outer conducting cylinder 40, disposed in the extension of the frame 20, between which is defined an annular space 44. The output circuit is substantially symmetrical with the electron gun 1 with respect to a plane normal to the plane of the figure, i.e. the outer conductor 40 comprises an annular shoulder 43 and a screen 41 bearing, for example by lugs, on the shoulder 43 and defining with this shoulder a circular slit 42 for the passage of the electron beam 8. The beam is received by an annular protrusion 50 of the inner conductor 5.

Between the elements 21, 23 on the one hand and 41, 43 on the other hand, there is a zone 3 called the injection region. This zone is limited laterally by extensions 25 and 45 of the walls 20 and 40 respectively, without them contacting each other in order to form a slit 71 between them.

The generator according to the invention furthermore comprises a microwave modulation circuit 7, which, in this embodiment, is of coaxial type. The central conductor of the circuit is formed by the wall 40 and the outer conductor by a wall 70 in the form of a hollow cylinder, still having the axis ZZ, defining with the wall 40 an annular space 74, the outer conductor 70 connecting with the part 25 of the frame 20.

The functioning of this device is as follows.

The application to the cathode 11 of a negative voltage with respect to that of the anode causes the emission of the annular electron beam 8. By way of example, the frame 20, the screen 21 and the elements of the output circuit 4 are at earth potential and a voltage $-V_o$ is applied to the cathode 11. Preferably there is applied to the structure, using means as shown in FIG. 1, a longitudinal magnetic field (along the axis ZZ) to focus the beam 8 thus produced.

The mechanism of formation of a virtual cathode is recalled hereafter. Inside an electron beam there is a space charge: on the axis of the beam, the potential and the velocity of the electrons are lower than at the periphery. If the electron density and consequently the current carried increase, the potential and the velocity of the electrons reduce down to zero; the electrons then form a negatively charged accumulation called a virtual cathode. This accumulation of electrons oscillates on the longitudinal axis, giving rise to an electromagnetic field. The frequency of the oscillations depends in particular on the injection current and it is commonly measured in Gigahertz. Furthermore, the maximum current intensity beyond which the electrons form a virtual cathode is a function of the potential of the electron beam and of the dimensions of the beam and of the injection region 3. More precisely, the maximum current for a given electron beam becomes lower as the diameter of the injection zone 3 increases.

According to the invention, the dimensions of the device (electron gun and injection zone) are chosen and the current of the electron beam is chosen such that it is slightly less than the maximum current capable of passing through the region 3, beyond which current there is the formation of a virtual cathode.

An alternating electric field is brought through the modulation circuit 7. The voltage between the parts 25 and 45 resulting from this field must have an amplitude which is sufficient, for one of the alternations, for the electron beam 8 to be stopped by a mechanism of the virtual cathode type and to no longer reach the output circuit 4, the electrons then being absorbed by the walls delimiting the injection zone 3. In the next alternation, the voltage applied between the same elements 25 and 45 re-establishes the beam. The current of the beam is thus modulated in intensity at the frequency of the modulation signal. The output circuit 4 is then excited by the preceding modulated current and thus ensures the transformation into microwave energy of at least part of the energy of the electrons of the beam. The screens 21 and 41 conventionally have the function of absorbing the divergent electrons. It should be noted that the modulation (7) and output (4) microwave circuits allow, by the selection of their dimensions, the precise definition of the frequency of the modulation signal and, that which is the sought object, the frequency of the output signal, thus allowing the obtaining of a good quality signal.

It should also be noted that, in order to obtain satisfactory functioning, it is not necessary to cause the complete formation of a virtual cathode. The maximum period of the alternating modulation field can be only a fraction of the switch-over time of the beam between the passing state and the virtual cathode state. In practice it can be in the order of the transit time of the electrons through the structure. The generator described here, like a vircator, is particularly compact. The length of the injection region 3, limited by the screens 21 and 41 is, in practice, in the order of one operating wavelength.

Furthermore the application of a DC voltage $V_o$ can raise technical problems because of the order of magnitude of the voltages (MV) and of the currents (kA) used. It is therefore possible to use voltage pulses having a duration for example in the order of a hundred nanoseconds, transmitted to the cathode through the coaxial structure, for example. The duration of these pulses remains long with respect to the period of the pulses produced, typically in the order of a hundred picoseconds.

A device providing amplification of the signal supplied by the modulation circuit has been described above. As is well known, it is possible to produce an oscillator with this structure by adding to it means of reinjection in the modulation circuit of a part of the signal supplied by the output circuit and doing this with an appropriate phase, which is related to the dimensions of the circuit, as is known. The means of reinjection such as shown in FIG. 2 can be produced by any known means, such as a coupling loop produced in an opening made in the wall 40 or a circuit external to the generator shown.

Figure 2:
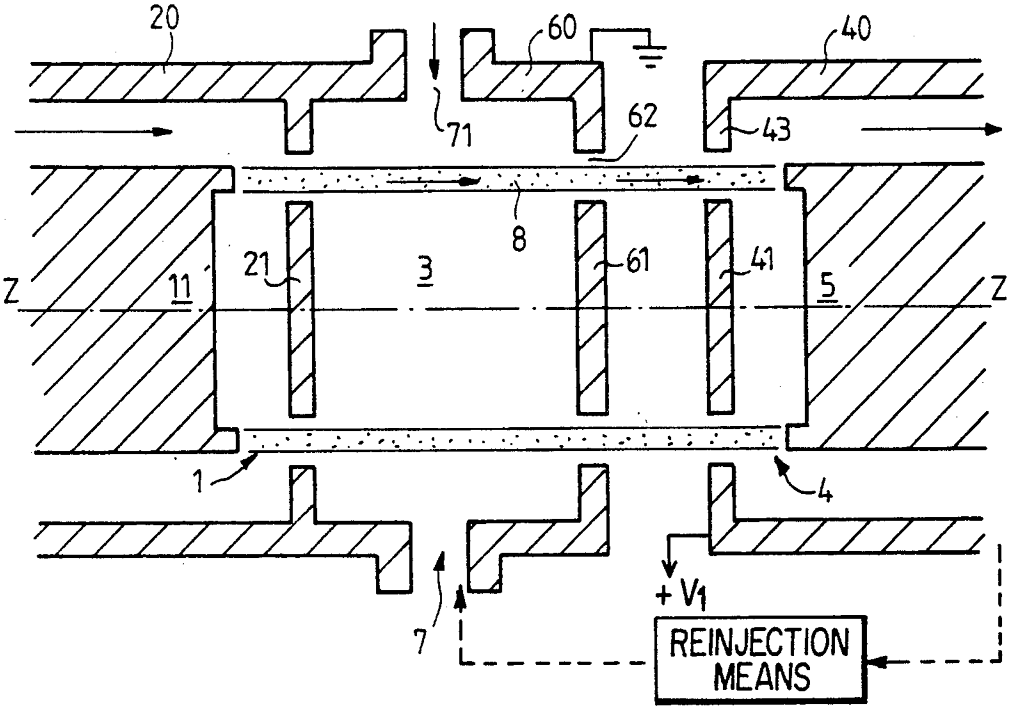
FIG. 2 shows a second embodiment of the device according to the invention in which it comprises means conferring a post-acceleration on the electron beam.

FIG. 2 shows a second embodiment of the device according to the invention in which means are provided for the post-acceleration of the beam after modulation, in order to improve the efficiency of the assembly.

In this figure the electron gun 1, the modulation circuit 7 and the output circuit 4 are found again but the whole of the circuit 4 has been electrically insulated from the previous elements.

More precisely, there is again found the gun 1 identical to that described in FIG. 1, i.e. composed of the cathode 11, the frame 20 and the screen 21. The output circuit 4 is also formed as in FIG. 1 by the inner cylindrical conductor 5 surrounded by the conductor 40, the shoulder 43 and the screen 41. However, in this embodiment, the injection zone is no longer closed by the screen 21 and the shoulder 43 but by a conducting element 61 similar to the screen 41 and an external conductor 60, disposed in the extension of the armature 20 and forming with the latter the slit 71 to which the modulation circuit is connected. The element 60 furthermore forms an annular slit 62 with the screen 61 to allow the passage of the electron beam 8. The elements 60 and 61 are therefore electrically insulated both from the gun 1 and the output circuit 4.

In operation, there is applied, as before, a voltage $-V_o$ (see FIG. 1) to the cathode with respect to the anode, the modulation signal by means of the circuit 7 and, furthermore, a post-acceleration voltage $+V_1$ to the output circuit with respect to the wall 60 (see FIG. 2) which is for example at the anode potential. In this way an acceleration of the electrons is produced on emerging from the injection zone 3.

Figure 3:
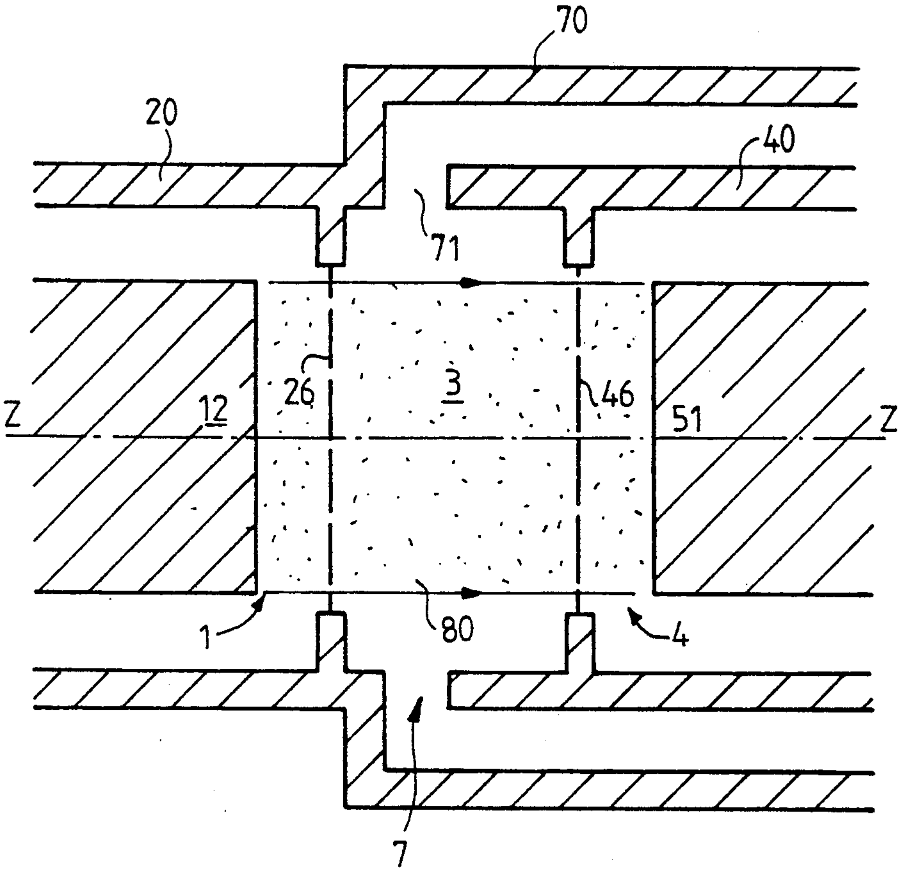
FIG. 3 shows a third embodiment of the device according to the invention, in which the electron beam used is a full cylindrical beam.

FIG. 3 shows a third embodiment of the device according to the invention in which the electron beam is a full cylinder.

In this figure, by way of example there are again found the same elements as in FIG. 1 except for the cathode of the gun 1, the inner conductor of the output circuit 4 and the screens of the gun and of the output circuit.

In this embodiment, the emitting surface of the cathode, now referenced 12, of the gun 1 is in the form of a disc such that it emits a full cylindrical electron beam 80. Similarly, the inner conductor of the output circuit 4, now referenced 51, is constituted by a flat surface in the form of a disc. The screens 21 and 24 in FIG. 1 have been replaced here by the elements referenced 26 and 46, constituted by grids or metallic sheets sufficiently thin for their absorption of electrons to be very low.

It should be noted that, in order that a satisfactory functioning may be obtained, the diameter of the cathode 12 must be substantially less than the wavelength of the microwave energy obtained at the output, for example in the order of a half-wavelength.

The above description has of course been given by way of non-limitative example. Thus, in particular, various microwave circuits have been shown as being of the coaxial type but can be replaced by waveguides.

We claim:

1. A device for producing microwave energy frequencies comprising:

an electron gun, producing an electron current carrying beam, disposed in an injection region wherein said injection region is capable of carrying a maximum current and wherein the current carried by said beam is less than the maximum current capable of being carried in the injection region;

a microwave modulation circuit coupled to and applying an alternating voltage in said injection region, said alternating voltage having an amplitude sufficient for triggering, during one alternation, the formation of a virtual cathode which prevents the passage of electrons, and, during the next alternation allows the passage of electrons again, the current transported by the beam thus being modulated at a frequency of the alternating voltage;

an output microwave circuit, coupled to said modulator circuit, for providing a microwave output substantially at one of the frequency of the alternating voltage, a multiple of the frequency of the alternating voltage, and a submultiple of the frequency of the alternating voltage, wherein said output circuit is excited by the current transported by the beam which is modulated at the frequency of the alternating voltage thus allowing transformation into microwave energy of at least a portion of energy associated with the electrons of said beam.

2. A device according to claim 1 wherein the output circuit is a coaxial sealed structure, said structure being coaxial with said electron gun.

3. A device according to claim 1 wherein the modulation circuit is a coaxial structure, said structure being coaxial with said electron gun.

4. Device according to one of claims 2 or 3, characterized in that a central conductor (40) of the modulation circuit is constituted by an external conductor of the output circuit.

5. A device according to either of claims 1 or 2, further including a means for electrically insulating the output circuit from the injection region and said device further including means for applying an electron acceleration voltage between the injection region and the output circuit.

6. Device according to either of claims 1 or 2, characterized in that the electron beam is in the form of a hollow cylinder.

7. Device according to either of claims 1 or 2, characterized in that the electron beam is in the form of a full cylinder.

8. A device according to either of claims 1 or 2 further comprising a means of reinjection coupled between the output circuit and the modulation circuit for reinjection of a portion of the output supplied by the output circuit thus forming an oscillator.

9. Device according to either of claims 1 or 2, characterized in that it furthermore comprises means for applying a magnetic field for focussing the electron beam.

* * * * *